(12) United States Patent
Baumgartner et al.

(10) Patent No.: US 12,306,264 B2
(45) Date of Patent: May 20, 2025

(54) METHOD AND APPARATUS FOR DETECTING AGING-DICTATED DAMAGE OR DELAMINATION ON COMPONENTS, IN PARTICULAR POWER MODULES OF POWER ELECTRONIC DEVICES, AND POWER ELECTRONIC DEVICE, IN PARTICULAR CONVERTER

(71) Applicant: Siemens Aktiengesellschaft, Munich (DE)

(72) Inventors: Robert Baumgartner, Puchheim/Bhf. (DE); Martin Honsberg, Großkarolinenfeld (DE); Gerhard Mitic, Munich (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 392 days.

(21) Appl. No.: 17/626,901

(22) PCT Filed: Jul. 10, 2020

(86) PCT No.: PCT/EP2020/069580
§ 371 (c)(1),
(2) Date: Jan. 13, 2022

(87) PCT Pub. No.: WO2021/013586
PCT Pub. Date: Jan. 28, 2021

(65) Prior Publication Data
US 2022/0260647 A1    Aug. 18, 2022

(30) Foreign Application Priority Data
Jul. 25, 2019   (DE) ............... 10 2019 211 104.1

(51) Int. Cl.
*G01R 31/42*  (2006.01)
*G01N 22/02*  (2006.01)
(Continued)

(52) U.S. Cl.
CPC ............. *G01R 31/42* (2013.01); *G01N 22/02* (2013.01); *G01N 29/041* (2013.01); *G01N 29/11* (2013.01);
(Continued)

(58) Field of Classification Search
CPC ........ G01N 22/00; G01N 22/02; G01N 29/11; G01N 29/07
See application file for complete search history.

(56) References Cited

U.S. PATENT DOCUMENTS 5,335,184 A * 8/1994 Hildebrand ............ G01N 29/11
                                                 702/34
6,020,821 A   2/2000 Bauerschmidt et al.
(Continued)

FOREIGN PATENT DOCUMENTS

CN      1213463 A    4/1999
CN    104965153 A   10/2015
(Continued)

OTHER PUBLICATIONS

International Search Report for PCT/EP2020/069580 issued Oct. 15, 2020.
(Continued)

*Primary Examiner* — Lam S Nguyen
(74) *Attorney, Agent, or Firm* — Schmeiser, Olsen & Watts LLP

(57) ABSTRACT

To facilitate a reliable detection of age-related damage or delamination on components the following is proposed: [i] within the scope of radiofrequency reflectometry, scanning a component by radiofrequency signal irradiation in the
(Continued)

micrometer or millimeter wavelength range and by measuring at least one reflection signal, which was reflected at the component, in punctiform, one-dimensional or two-dimensional fashion for the purposes of generating at least one first radiofrequency image representation; [ii] scanning the component in direct time offset fashion with respect to the radiofrequency signal irradiation by a combination of ultrasonic signal irradiation and the radiofrequency signal irradiation in the micrometer or millimeter wavelength range and by measuring at least one further reflection signal, which was reflected at the component; and [iii] comparing the radiofrequency image representations generated based on the reflection signals, wherein determined changes in the radiofrequency image representations indicate damage or delamination on the component.

13 Claims, 1 Drawing Sheet

(51) Int. Cl.
G01N 29/04 (2006.01)
G01N 29/11 (2006.01)
G01R 31/26 (2020.01)

(52) U.S. Cl.
CPC ..... *G01R 31/2608* (2013.01); *G01R 31/2642* (2013.01); *G01N 2223/052* (2013.01); *G01N 2223/401* (2013.01)

(56) References Cited

U.S. PATENT DOCUMENTS

| | | | |
|---|---|---|---|
| 7,040,168 B1 * | 5/2006 | Merkel | G01N 29/07 73/601 |
| 10,114,062 B2 | 10/2018 | Dawley | |
| 2003/0098697 A1 * | 5/2003 | Tanaka | G01N 22/02 324/637 |
| 2005/0253595 A1 | 11/2005 | France | |
| 2007/0073144 A1 | 3/2007 | Simpkin | |
| 2007/0080681 A1 | 4/2007 | Hoelzl et al. | |
| 2012/0296204 A1 | 11/2012 | Carr | |
| 2017/0292919 A1 | 10/2017 | McCollough et al. | |
| 2021/0262895 A1 | 8/2021 | Heinzelmaier | |

FOREIGN PATENT DOCUMENTS

| | | |
|---|---|---|
| CN | 105259426 A | 1/2016 |
| CN | 105699493 A | 6/2016 |
| CN | 106841937 A | 6/2017 |
| CN | 109923410 A | 6/2019 |
| DE | 10053112 A1 | 5/2002 |
| DE | 102014204893 A1 | 9/2015 |
| DE | 102015202077 A1 | 8/2016 |
| DE | 102016201788 A1 | 8/2017 |
| DE | 102017109398 A1 | 11/2017 |
| DE | 102018209609 A1 | 12/2019 |
| EP | 1344044 B1 | 7/2009 |
| JP | S63163289 A | 7/1988 |
| KR | 100962591 B1 | 6/2010 |
| WO | WO 2013127630 A1 | 9/2013 |
| WO | 2013143704 A2 | 10/2013 |
| WO | 2015139990 A1 | 9/2015 |

OTHER PUBLICATIONS

Zhang Guang Feng et al.; "Fusion for Visible Light and Millimeter Wave Radiometric Images";( Key Laboratory of Education Ministry for Image Processing and Intelligent Control, Huazhong University of Science and Technology, Wuhan430074, China); vol. 34; No. 5; 10.2004, 3 pages (English Abstract).

* cited by examiner

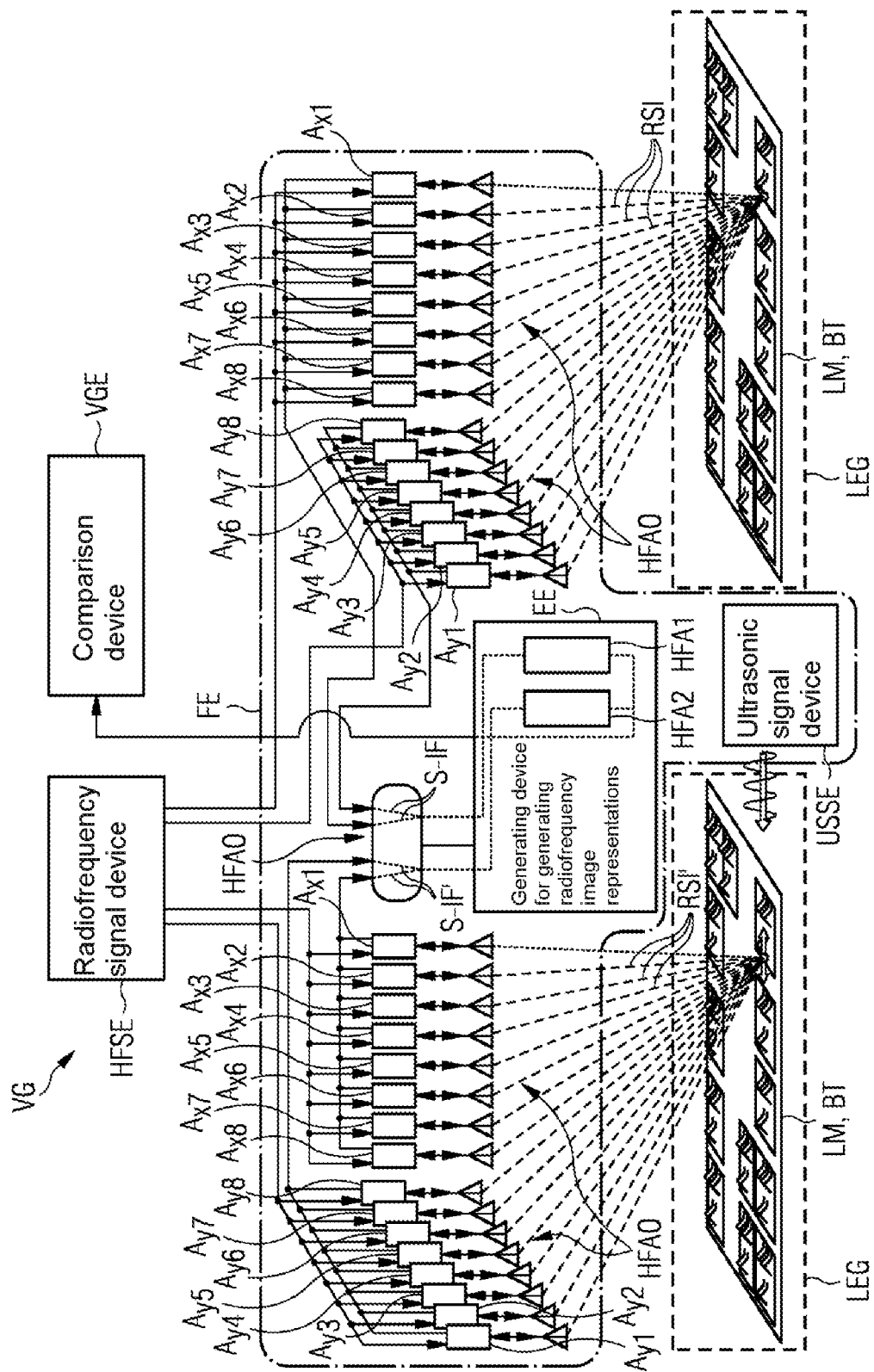

METHOD AND APPARATUS FOR DETECTING AGING-DICTATED DAMAGE OR DELAMINATION ON COMPONENTS, IN PARTICULAR POWER MODULES OF POWER ELECTRONIC DEVICES, AND POWER ELECTRONIC DEVICE, IN PARTICULAR CONVERTER

CROSS-REFERENCE TO RELATED APPLICATIONS

This application claims priority to PCT Application No. PCT/EP2020/069580, having a filing date of Jul. 10, 2020, which claims priority to DE Application No. 10 2019 211 104.1, having a filing date of Jul. 25, 2019, the entire contents both of which are hereby incorporated by reference.

FIELD OF TECHNOLOGY

The following relates to a method for detecting aging-dictated damage or delamination on components, in particular power modules of power electronic devices, an apparatus for detecting aging-dictated damage or delamination on components, in particular power modules of power electronic devices, and a power electronic device, in particular a converter.

BACKGROUND

The age-dictated arising of damage or delamination can be observed, in principle, on components with a wide variety of material constitutions or compositions which, in a given use or operation environment, are exposed to continuous or cyclically changing physical loads. In this regard, power modules, such as e.g., "Insulated Gate Bipolar Transistor <IGBT>" modules, in power electronic devices, such as e.g., a converter, are subject to aging as a result of normal operation within their specified operating limits. The aging is principally caused by a high number of load cycles of operational heating and cooling, which result in the gradual destruction of chip solder layers below the semiconductor chips and in fatigue of bond wires and chip metalizations that conduct the current into the switching and rectifying chips. Typical fault mechanisms established here are bond lift-off, heel crack and solder fatigue of chip and system solder.

What is of interest, therefore, is a reliable determination of aging of components, in particular of power modules in power electronic devices, such as converters, which permits a sufficiently accurate prediction of the remaining operational service life.

With the aid of a radar, it is possible to detect the aging-dictated electrical and mechanical changes. This necessitates monitoring the change in reflections of the component or power module in the microwave or millimeter-wave range over a period of up to 30 years. However, the radar systems generally do not have long-term stability over this period of time, and so it is not possible to compare an RF reference measurement with a measurement in the aged operating state. A reliable determination of aging is therefore not straightforwardly possible owing to the drift of the radar system.

In fields of use in which failure of a component or power module must absolutely be avoided, thus e.g., in the case of converters in offshore wind farms, in traction applications, etc., there are various solution paths for combating component or power module failures by way of redundancy or preventive exchange at the maintenance level. In this case, the expected service life and the service life already used up can be deduced with the aid of thermal models and accelerated service life testing. These calculations are beset by large errors, however, on account of the models used.

In the case of power modules, some power module manufacturers offer for example IGBT modules containing diodes, integrated as temperature sensors in IGBT chips. Aging can thus be deduced indirectly by way of the increase in temperature of the "Insulated Gate Bipolar Transistors <IGBTs>".

There is yet no commercial solution for monitoring the state of power modules in converters with regard to a service life prediction.

To compensate for drift in RF network analyzers, calibration devices are offered which recalibrate the system before each measurement. However, at present there are no commercial radar applications having a long-term stability of a number of years.

SUMMARY

An aspect relates to a method and an apparatus for detecting aging-dictated damage or delamination on components, in particular power modules of power electronic devices, and also a power electronic device, in particular a converter, which make possible a reliable detection of the aging-dictated damage or delamination on the components, such as on the power modules, for example, used in the power electronic devices or converters, which permits a sufficiently accurate prediction of the remaining operational service life of the component or the power module.

Proceeding from the detection method defined in the preamble of patent claim 1, this object is achieved by the features specified in the characterizing part of patent claim 1.

Furthermore, proceeding from the detection apparatus defined in the preamble of patent claim 6, the object is achieved by the features specified in the characterizing part of patent claim 6.

Moreover, proceeding from the power electronic device defined in the preamble of patent claim 13, the object is achieved by the features specified in the characterizing part of patent claim 13.

The concept underlying embodiments of the invention as claimed in independent claims 1, 6 and 13 consists in the following:

1) in the course of radiofrequency reflectometry, a component, in particular a power module, is scanned by radiofrequency signal irradiation in the microwave or millimeter-wave range and by measurement of at least one reflection signal, which was reflected at the component as a consequence of the radiofrequency signal irradiation, in punctiform, one-dimensional or two-dimensional fashion for the purpose of generating at least one first radiofrequency image representation, in particular based on mathematical methods for image reconstruction,
2) the component is scanned directly with a time offset with respect to the radiofrequency signal irradiation by a combination of ultrasonic signal irradiation and the radiofrequency signal irradiation in the microwave or millimeter-wave range and by measurement of at least one further reflection signal, which was reflected at the component as a consequence of the ultrasonic signal irradiation and radiofrequency signal irradiation, in punctiform, one-dimensional or two-dimensional fashion for the purpose of generating at least one second radiofrequency image representation, and 3) the radiofrequency image representations generated based on the reflection signals are compared, wherein ascertained changes in the radiofrequency image representations indicate damage or delamination on the component.

Particularly in the case of power modules, aging takes place gradually over decades of electrical operation. According to embodiments of the invention, in the case of the combination of the ultrasonic signal irradiation and the radiofrequency signal irradiation in the microwave or millimeter-wave range, the intention is to measure the reflection signals reflected at the power module in the case of this combination of the ultrasonic signal irradiation and the radiofrequency signal irradiation, i.e. under ultrasonic excitation, and to compare them with a temporally succeeding RF measurement, in which exclusively the radiofrequency signal is radiated in, i.e. no ultrasonic excitation takes place.

In this case, the changes thereby observed in the reflection signals and radiofrequency image representations are directly sensitive to the damage or delamination in the power module. Since the measurements take place in direct temporal succession, a complex drift correction of an RF measuring system that carries out the measurements is not required, changes in the reflection signals and radiofrequency image representations correlate directly with the damage or delamination in the power module, and aging can thus be deduced. The aging of the power module principally takes place at the location of the power semiconductors, e.g., the IGBT chip or the diode.

The ultrasound-based irradiation is effected with a frequency of typically 10-200 kHz, whereas the radiofrequency signal irradiation takes place in narrowband fashion in the multi-digit GHz range. In this case, the combined interaction of ultrasound with radiofrequency can be detected as a sideband of the radiofrequency signal.

For the ultrasonic signal irradiation, which takes place directly in the bottom region of the power module as claimed in claims 5 and 12, at least one sonotrode is used as claimed in claims 4 and 11.

The ultrasonic signal irradiation is very sensitive with regard to local cracks in the connecting layers of the power module, in particular the solder joints and bonds. Depending on the fatigue in the connecting planes of the bonds and solder joints, these damage planes are excited to effect different local geometric oscillations in the ultrasonic range. The scanning by the radiofrequency irradiation in the microwave or millimeter-wave range, in which based on mathematical methods for image reconstruction the two radiofrequency image representations are generated, first without the ultrasonic signal irradiation in the case of the first radiofrequency image representation and with the ultrasonic signal irradiation in the case of the second radiofrequency image representation, is effected in two-dimensional fashion. In this case, as claimed in claim 7, a radiofrequency antenna arrangement having a plurality of antennas is provided, which scans the power module in rows and columns, wherein each antenna serves or functions alternately as transmitter and receiver and in this case the duration for functioning/serving as receiver is a multiple of the duration for functioning/serving as transmitter, the multiple being dependent on the number of antennas in the radiofrequency antenna arrangement. As claimed in claim 8, the radiofrequency antenna arrangement is configured as an antenna array or as a T-shaped arrangement. In the transmitting antenna function, radiofrequency signals are coupled into the power module wirelessly and, in the receiving antenna function, the reflection signals are measured with a plurality of antennas. The measured reflection behavior changes as a result of thermomechanical crack initiations in the bond wires and solder joints during electrical operation of the power module. By irradiation and detection with the array of antennas, it is possible to generate the respective radiofrequency image representation of the power module in the microwave or millimeter-wave range.

Using the mathematical method for image reconstruction, the radiofrequency image representations can be calculated from the reflection signals received at the RF antenna arrangement in the combined frequency band of ultrasound.

During two-dimensional scanning, as claimed in claims 2 and 9, the changes in the radiofrequency image representations are represented as a difference image representation, enabling selective quantification of location and extent of damage or delamination on the component or the power module. In this regard, the aged regions on the component or the power module, with increasing aging, stand out from the regions without local damage.

In this case, as claimed in claims 3 and 10, the damage or delamination on the component or the power module is indicated by maximum amplitudes in the difference image representation.

Owing to the permanent drift of radar systems in the microwave or millimeter-wave range, long-term changes on the component or the power module can be identified only with considerable complexity. The combination of ultrasonic signal irradiation and the radiofrequency signal irradiation in the microwave or millimeter-wave range enables a direct detection of aging-dictated damage or delamination on components, in particular power modules. The drift of the RF measuring system, also referred to as radar system, does not have to be corrected in a complex manner since temporally directly successive RF measurements with and without ultrasound are compared. The requirements made of the RF system and the measurement electronics are far less stringent than in the case of drift-corrected set-ups. A far higher measurement accuracy and dynamic range of the measurement method can be achieved by a selective radiofrequency image representation of the damage or delamination. Moreover, a complex drift correction is no longer required for the service life monitoring of the component or power module over periods of many years to decades, the monitoring being effected at periodic intervals of the aged power module.

BRIEF DESCRIPTION

Some of the embodiments will be described in detail, with reference to the following FIGURES, wherein like designations denote like members, wherein:

FIG. 1 shows an embodiment of an apparatus for detecting aging-dictated damage or delamination on a power module for a power electronic device.

DETAILED DESCRIPTION

FIG. 1 shows an apparatus VG for detecting aging-dictated damage or delamination on a power module LM for a power electronic device LEG. Instead of the power module LM, however, it is also possible to examine any other component BT with regard to the occurrence of aging-dictated damage or delamination and in the process to detect the occurrences of aging-dictated damage or delamination.

The power electronic device LEG is a converter, for example, which contains the apparatus VG described in greater detail below.

The apparatus VG contains a radiofrequency antenna arrangement HFAO configured for transmitting and receiving signals, which arrangement, in the course of radiofrequency reflectometry, scans the power module LM, BT by radiofrequency signal irradiation in the microwave or millimeter-wave range and by measurement of at least one reflection signal RSI, which was reflected at the power module LM, BT as a consequence of the radiofrequency signal irradiation, in punctiform, one-dimensional or two-dimensional fashion. The radiofrequency signal irradiation is effected based on radiofrequency signals supplied by a radiofrequency signal device HFSE. In this case, the radiofrequency signal device HFSE can as illustrated in the FIGURE be part of the apparatus VG or else can alternatively be assigned externally thereto.

The number of antennas contained in the radiofrequency antenna arrangement HFAO for transmitting and receiving the signals is dependent on the manner in which the scanning is ultimately intended to be effected.

For punctiform scanning, at least two antennas would be required, one which serves as transmitting antenna, while the other functions as receiving antenna. A radiofrequency signal irradiation in the microwave or millimeter-wave range on the power module LM, BT would be effected via the transmitting antenna and a reflection signal RSI reflected at the power module LM, BT as a consequence of the radiofrequency signal irradiation would be measured via the receiving antenna. An antenna changeover would then occur, the transmitting antenna becoming the receiving antenna and the receiving antenna becoming the transmitting antenna.

For one-dimensional scanning, a plurality of antennas arranged in a series would be required, wherein each antenna in the series serves or functions alternately as transmitter and receiver and in this case the duration for functioning/serving as receiver is a multiple of the duration for functioning/serving as transmitter, the multiple being dependent on the number of antennas arranged in series in the radiofrequency antenna arrangement HFAO.

The way in which this alternate serving or functioning as transmitter and receiver with different durations functions very generally in one preferred implementation of the exemplary embodiment will be described below based on the radiofrequency antenna arrangement HFAO illustrated in the FIGURE with an antenna array, containing a plurality of antennas $A_{x1} \ldots A_{x8}$ and $A_{y1} \ldots A_{y8}$, for the two-dimensional scanning. Alternatively, instead of the configuration as an antenna array, the radiofrequency antenna arrangement HFAO can also be configured as a T-shaped arrangement. During two-dimensional scanning, the power module LM, BT is scanned in rows and columns, wherein again each antenna serves or functions alternately as transmitter and receiver and in this case as will become apparent below—the duration for functioning/serving as receiver is a multiple of the duration for functioning/serving as transmitter, the multiple being dependent on the number of antennas in the radiofrequency antenna arrangement HFAO.

In the case illustrated in FIG. 1, in a first scanning step, a first radiofrequency signal irradiation in the microwave or millimeter-wave range on the power module LM, BT is effected via the antenna $A_{x1}$ and the reflection signals RSI reflected at the power module LM, BT as a consequence of the radiofrequency signal irradiation are measured via the other antennas $A_{x2} \ldots A_{x8}$ and $A_{y1} \ldots A_{y8}$. Antenna changeovers are then carried out for a second scanning step, the antenna $A_{x1}$ becoming the receiving antenna and the antenna $A_{x2}$ becoming the transmitting antenna. In the second scanning step, a second radiofrequency signal irradiation in the microwave or millimeter-wave range on the power module LM, BT is effected via the antenna $A_{x2}$ and the reflection signals RSI reflected at the power module LM, BT as a consequence of the radiofrequency signal irradiation are measured via the other antennas $A_{x1}, A_{x3} \ldots A_{x8}$ and $A_{y1} \ldots A_{y8}$. According to this principle, each antenna of the antennas $A_{x1} \ldots A_{x8}$ and $A_{y1} \ldots A_{y8}$ becomes a transmitting antenna at one time, while all the other antennas are receiving antennas in each case. Scan information S-IF is formed from these reflection signals RSI measured by the radiofrequency antenna arrangement HFAO.

The apparatus VG then further contains a generating device EE for generating radiofrequency image representations, which is connected to the radiofrequency antenna arrangement HFAO. The scan information is passed on to the generating device EE by the radiofrequency antenna arrangement HFAO. In the generating device EE, at least one first radiofrequency image representation HFA1 is generated based on scan information S-IF supplied by the radiofrequency antenna arrangement HFAO. This generation of the first radiofrequency image representation HFA1 takes place based on mathematical methods for image reconstruction.

Furthermore, the apparatus VG contains an ultrasonic signal device USSE, which together with the radiofrequency antenna arrangement HFAO and the generating device EE forms a functional unit FE. The ultrasonic signal device USSE contains at least one sonotrode.

The functional unit FE formed, as far as its function is concerned, is configured in such a way that the power module LM, BT is scanned directly with a time offset with respect to the above-described radiofrequency signal irradiation which is to say directly after the radiofrequency signal irradiation in the microwave or millimeter-wave range and the two-dimensional scanning of the power module LM, BT by measurement of the reflection signal RSI for the purpose of generating the first radiofrequency image representation HFA1—by a combination of ultrasonic signal irradiation, radiated in by the ultrasonic signal device USSE, and the radiofrequency signal irradiation in the microwave or millimeter-wave range as has been described above, and by measurement of at least one further reflection signal RSI', which was reflected at the power module LM, BT as a consequence of the combination of the ultrasonic signal irradiation and radiofrequency signal irradiation, in punctiform, one-dimensional or two-dimensional fashion.

The ultrasonic signal irradiation is effected by the sonotrode directly in the bottom region of the power module LM.

The scanning is effected analogously to that in the case of the sole, above-described radiofrequency signal irradiation in the microwave or millimeter-wave range. Further scan information S-IF' is formed from the further reflection signals RSI' measured by the radiofrequency antenna arrangement HFAO in the process. The scan information is once again passed on to the generating device EE by the radiofrequency antenna arrangement HFAO. In the generating device EE at least one second radiofrequency image representation HFA2 is generated based on further scan information supplied by the radiofrequency antenna arrangement HFAO. The generation of the second radiofrequency image representation HFA2 also takes place based on mathematical methods for image reconstruction.

Finally, the apparatus VG also contains a comparison device VGE, which is connected to the generating device EE and functionally interacts with the functional unit FE in such a way that the radiofrequency image representations HFA1, HFA2 generated based on the reflection signals RSI, RSI' are compared, wherein ascertained changes in the radiofrequency image representations HFA1, HFA2 indicate damage or delamination on the power module LM, BT.

In this case, this comparison process can be manifested such that during two-dimensional scanning the changes ascertained in the radiofrequency image representations HFA1, HFA2 are represented in a difference image representation specifying location and extent of damage or delamination on the power module LM, BT. In this regard, e.g., the damage or delamination on the power module LM, BT can be indicated by maximum amplitudes in the difference image representation. In other words: a damage indicator is present which enables the damage to be determined from the maximum local amplitudes of the difference image.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A method for detecting aging-dictated damage or delamination on components, in which, in a course of radiofrequency reflectometry, a component is scanned by radiofrequency signal irradiation in a microwave or millimeter-wave range and by measurement of at least one reflection signal, which was reflected at the component as a consequence of the radiofrequency signal irradiation, in punctiform, one-dimensional or two-dimensional fashion for generating at least one first radiofrequency image representation based on mathematical methods for image reconstruction, wherein:
   a) the component is scanned directly with a time offset with respect to the radiofrequency signal irradiation by a combination of ultrasonic signal irradiation and the radiofrequency signal irradiation in the microwave or millimeter-wave range and by measurement of at least one further reflection signal, which was reflected at the component as a consequence of the ultrasonic signal irradiation and radiofrequency signal irradiation, in punctiform, one-dimensional or two-dimensional fashion for generating at least one second radiofrequency image representation, and
   b) the radiofrequency image representations generated based on the reflection signals are compared, wherein ascertained changes in the radiofrequency image representations indicate damage or delamination on the component.

2. The method as claimed in claim 1, wherein location and extent of damage or delamination on the component are specified during two-dimensional scanning with a difference image representation representing the changes in the radiofrequency image representations.

3. The method as claimed in claim 2, wherein the damage or delamination on the component is indicated by maximum amplitudes in the difference image representation.

4. The method as claimed in claim 1, wherein at least one sonotrode is used for the ultrasonic signal irradiation.

5. The method as claimed in claim 4, wherein if the component is the power module, the ultrasonic signal irradiation is radiated in directly in the bottom region of the power module.

6. An apparatus for detecting aging-dictated damage or delamination on components comprising:
   a radiofrequency antenna arrangement configured for transmitting and receiving, which arrangement, in a course of radiofrequency reflectometry, scans a component by radiofrequency signal irradiation in a microwave or millimeter-wave range and by measurement of at least one reflection signal, which was reflected at the component as a consequence of the radiofrequency signal irradiation, in punctiform, one-dimensional or two-dimensional fashion; and
   a generating device for generating radiofrequency image representations which based on mathematical methods for image reconstruction, based on scan information supplied by the radiofrequency antenna arrangement, generates at least one first radiofrequency image representation, wherein:
   a) an ultrasonic signal device, which together with the radiofrequency antenna arrangement and the generating device forms a functional unit and wherein the functional unit is configured in such a way that the component is scanned directly with a time offset with respect to the radiofrequency signal irradiation by a combination of ultrasonic signal irradiation, radiated in by the ultrasonic signal device, and the radiofrequency signal irradiation in the microwave or millimeter-wave range and by measurement of at least one further reflection signal, which was reflected at the component as a consequence of the ultrasonic signal irradiation and radiofrequency signal irradiation, in punctiform, one-dimensional or two-dimensional fashion, and at least one second radiofrequency image representation is generated based on further scan information supplied by the radiofrequency antenna arrangement; and
   b) a comparison device, which functionally interacts with the functional unit in such a way that the radiofrequency image representations generated based on the reflection signals are compared, wherein ascertained changes in the radiofrequency image representations indicate damage or delamination on the component.

7. The apparatus as claimed in claim 6, wherein the radiofrequency antenna arrangement is configured in such a way that during two-dimensional scanning the component is scanned in rows and columns, wherein each antenna serves or functions alternately as transmitter and receiver, wherein the duration for functioning/serving as receiver is a multiple of the duration for functioning/serving as transmitter, the multiple being dependent on the number of antennas in the radiofrequency antenna arrangement.

8. The apparatus as claimed in claim 7, wherein the radiofrequency antenna arrangement is configured as an antenna array or as a T-shaped arrangement.

9. The apparatus as claimed in claim 6, wherein the functional unit formed from the ultrasonic signal device and the radiofrequency antenna arrangement, and the comparison device are configured in such a way that location and extent of damage or delamination on the component are specified during two-dimensional scanning with a difference image representation representing the changes in the radiofrequency image representations.

10. The apparatus as claimed in claim 9, wherein the functional unit formed from the ultrasonic signal device and the radiofrequency antenna arrangement, and the comparison device are configured in such a way that the damage or delamination on the component is indicated by maximum amplitudes in the difference image representation.

11. The apparatus as claimed in claim 6, wherein the ultrasonic signal device contains at least one sonotrode.

12. The apparatus as claimed in claim 11, wherein the sonotrode is configured in such a way that if the component is the power module, the ultrasonic signal irradiation is radiated in directly in the bottom region of the power module.

13. A power electronic device, in particular a converter, characterized by an apparatus as claimed in claim 6 which carries out the method as.

* * * * *